(12) United States Patent
Nakajima et al.

(10) Patent No.: US 12,451,364 B2
(45) Date of Patent: Oct. 21, 2025

(54) PLASMA PROCESSING METHOD

(71) Applicant: HITACHI HIGH-TECH CORPORATION, Tokyo (JP)

(72) Inventors: Kenta Nakajima, Tokyo (JP); Toru Ito, Tokyo (JP); Fumiyoshi Ofuji, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 18/279,827

(22) PCT Filed: Apr. 26, 2022

(86) PCT No.: PCT/JP2022/018912
§ 371 (c)(1),
(2) Date: Aug. 31, 2023

(87) PCT Pub. No.: WO2023/209812
PCT Pub. Date: Nov. 2, 2023

(65) Prior Publication Data
US 2025/0046620 A1    Feb. 6, 2025

(51) Int. Cl.
*H01L 21/3213*    (2006.01)
*H01J 37/32*    (2006.01)
(Continued)

(52) U.S. Cl.
CPC .. *H01L 21/32136* (2013.01); *H01J 37/32146* (2013.01); *H01J 37/32174* (2013.01);
(Continued)

(58) Field of Classification Search
None
See application file for complete search history.

(56) References Cited

U.S. PATENT DOCUMENTS 2,981,287 A    4/1961    Caslow
3,452,781 A    7/1969    Napolitano
(Continued)

FOREIGN PATENT DOCUMENTS

JP    S62-14429 A    1/1987
JP    H02-230729 A    9/1990
(Continued)

OTHER PUBLICATIONS

Search Report mailed Jul. 19, 2022 in International Application No. PCT/JP2022/018912.
(Continued)

*Primary Examiner* — Roberts P Culbert
(74) *Attorney, Agent, or Firm* — Miles & Stockbridge, P.C.

(57) ABSTRACT

A plasma processing method for uniformly removing a processing target film in a lateral direction even when a depth of a trench is increased, in particular, a method for plasma-etching a tungsten film of a stacked film formed by alternately stacking an insulating film and the tungsten film. The method includes: a first depositing step of depositing a film; a first etching step of etching after the first depositing step; a second depositing step of depositing a film; a second etching step of etching using a mixed gas after the second depositing step; and a third etching step of etching after the second etching step, the second depositing step being performed after the first depositing step and the first etching step are repeated a predetermined number of times, and the second depositing step, the second etching step, and the third etching step are repeated a predetermined number of times.

5 Claims, 10 Drawing Sheets

(51) Int. Cl.

| | |
|---|---|
| *H01L 21/02* | (2006.01) |
| *H01L 21/311* | (2006.01) |
| *H10B 41/20* | (2023.01) |
| *H10B 43/20* | (2023.01) |
| *H10D 64/01* | (2025.01) |
| *H10D 64/66* | (2025.01) |
| *H10D 64/68* | (2025.01) |

(52) U.S. Cl.
CPC .. *H01L 21/02164* (2013.01); *H01L 21/31116* (2013.01); *H10B 41/20* (2023.02); *H10B 43/20* (2023.02); *H10D 64/035* (2025.01); *H10D 64/037* (2025.01); *H10D 64/665* (2025.01); *H10D 64/691* (2025.01); *H01J 37/32311* (2013.01); *H01J 2237/332* (2013.01); *H01J 2237/3341* (2013.01); *H01J 2237/3347* (2013.01)

(56) References Cited

U.S. PATENT DOCUMENTS

| | | |
|---|---|---|
| 3,760,843 A | 9/1973 | Larner |
| 4,450,031 A | 5/1984 | Ono et al. |
| 4,638,837 A | 1/1987 | Buike et al. |
| 4,669,404 A | 6/1987 | Yoneda |
| 4,844,767 A | 7/1989 | Okudaira et al. |
| 4,960,073 A | 10/1990 | Suzuki et al. |
| 5,178,962 A | 1/1993 | Miyamoto et al. |
| 5,195,045 A | 3/1993 | Keane et al. |
| 5,284,544 A | 2/1994 | Mizutani et al. |
| 5,712,592 A | 1/1998 | Stimson et al. |
| 5,770,922 A | 6/1998 | Gerrish et al. |
| 5,992,460 A | 11/1999 | Akimoto |
| 5,998,986 A | 12/1999 | Ido |
| 6,082,406 A | 7/2000 | Williamson, Jr. et al. |
| 6,145,541 A | 11/2000 | Hirota |
| 6,156,152 A | 12/2000 | Ogino et al. |
| 6,162,323 A | 12/2000 | Koshimizu |
| 6,192,937 B1 | 2/2001 | Fagerlie et al. |
| 6,265,831 B1 | 7/2001 | Howald et al. |
| 6,270,618 B1 | 8/2001 | Nakano et al. |
| 6,287,980 B1 | 9/2001 | Hanazaki et al. |
| 6,351,683 B1 | 2/2002 | Johnson et al. |
| 6,551,447 B1 | 4/2003 | Savas et al. |
| RE38,273 E | 10/2003 | Gerrish et al. |
| 6,677,711 B2 | 1/2004 | MacGearailt |
| 6,867,086 B1 | 3/2005 | Chen et al. |
| 6,919,689 B2 | 7/2005 | Jafarian-Tehrani et al. |
| 7,084,832 B2 | 8/2006 | Pribyl |
| 7,190,119 B2 | 3/2007 | Patrick et al. |
| 7,645,357 B2 | 1/2010 | Paterson et al. |
| 8,038,896 B2 | 10/2011 | Ikegami et al. |
| 8,546,266 B2 | 10/2013 | Mori et al. |
| 9,246,011 B2 | 1/2016 | Yamazaki et al. |
| 9,431,268 B2 | 8/2016 | Lill et al. |
| 9,548,228 B2 | 1/2017 | Chandrashekar et al. |
| 9,978,610 B2 | 5/2018 | Fung et al. |
| 10,121,686 B2 | 11/2018 | Ogawa et al. |
| 11,217,454 B2 | 1/2022 | Shinoda et al. |
| 2001/0022293 A1 | 9/2001 | Maeda et al. |
| 2002/0106845 A1 | 8/2002 | Chao et al. |
| 2002/0123229 A1 | 9/2002 | Ono et al. |
| 2003/0212507 A1 | 11/2003 | Wei et al. |
| 2004/0058541 A1 | 3/2004 | Ono et al. |
| 2004/0129671 A1 | 7/2004 | Ji et al. |
| 2004/0178180 A1 | 9/2004 | Kaji et al. |
| 2004/0185670 A1 | 9/2004 | Hamelin et al. |
| 2006/0037704 A1 | 2/2006 | Iwata et al. |
| 2006/0048892 A1 | 3/2006 | Arase et al. |
| 2006/0288934 A1 | 12/2006 | Takahashi et al. |
| 2007/0044716 A1 | 3/2007 | Tetsuka et al. |
| 2007/0163477 A1 | 7/2007 | Nagata et al. |
| 2007/0286967 A1 | 12/2007 | Ide et al. |
| 2008/0110400 A1 | 5/2008 | Satou et al. |
| 2008/0128087 A1 | 6/2008 | Hayano et al. |
| 2008/0190893 A1 | 8/2008 | Mori et al. |
| 2008/0268645 A1 | 10/2008 | Kao et al. |
| 2008/0277062 A1 | 11/2008 | Koshimizu et al. |
| 2009/0023296 A1 | 1/2009 | Nishizuka |
| 2009/0029564 A1 | 1/2009 | Yamashita et al. |
| 2010/0258529 A1 | 10/2010 | Mori et al. |
| 2011/0120649 A1 | 5/2011 | Satou et al. |
| 2011/0297533 A1 | 12/2011 | Mori et al. |
| 2012/0064726 A1 | 3/2012 | Yang et al. |
| 2012/0222751 A1 | 9/2012 | Okabe |
| 2012/0231553 A1 | 9/2012 | Okita et al. |
| 2012/0255617 A1 | 10/2012 | Miyazoe et al. |
| 2013/0228550 A1 | 9/2013 | Mori et al. |
| 2013/0270625 A1 | 10/2013 | Jang et al. |
| 2013/0319615 A1 | 12/2013 | Cho et al. |
| 2014/0020831 A1 | 1/2014 | Ohgoshi et al. |
| 2014/0057447 A1 | 2/2014 | Nozawa et al. |
| 2014/0091435 A1 | 4/2014 | Chan et al. |
| 2014/0102640 A1 | 4/2014 | Yokogawa et al. |
| 2014/0134842 A1 | 5/2014 | Zhang et al. |
| 2014/0151686 A1 | 6/2014 | Yamazaki et al. |
| 2014/0225503 A1 | 8/2014 | Mori et al. |
| 2014/0262034 A1 | 9/2014 | Ishibashi et al. |
| 2015/0011093 A1 | 1/2015 | Singh et al. |
| 2015/0072533 A1 | 3/2015 | Muraki et al. |
| 2015/0083582 A1 | 3/2015 | Dhindsa et al. |
| 2015/0179464 A1 | 6/2015 | Wang et al. |
| 2015/0262829 A1 | 9/2015 | Park et al. |
| 2015/0270148 A1 | 9/2015 | Shinoda et al. |
| 2015/0330519 A1 | 11/2015 | Maurer et al. |
| 2015/0357210 A1 | 12/2015 | Mori et al. |
| 2016/0035585 A1 | 2/2016 | Xiang et al. |
| 2016/0133530 A1 | 5/2016 | Sonoda et al. |
| 2016/0177443 A1 | 6/2016 | Kumar et al. |
| 2016/0379857 A1 | 12/2016 | Ogawa et al. |
| 2017/0053810 A1 | 2/2017 | Yang et al. |
| 2017/0069511 A1* | 3/2017 | Yang ............... H01J 37/32357 |
| 2017/0101713 A1 | 4/2017 | Wang et al. |
| 2017/0194166 A1 | 7/2017 | Tan et al. |
| 2017/0229314 A1 | 8/2017 | Tan et al. |
| 2018/0047595 A1 | 2/2018 | Kofuji et al. |
| 2018/0144948 A1 | 5/2018 | Maruyama et al. |
| 2018/0144977 A1 | 5/2018 | Yu et al. |
| 2018/0211824 A1 | 7/2018 | Kudo et al. |
| 2018/0330985 A1 | 11/2018 | Yu et al. |
| 2019/0043732 A1 | 2/2019 | Eason et al. |
| 2019/0067032 A1 | 2/2019 | Shinoda et al. |
| 2021/0233918 A1 | 7/2021 | Koshizawa et al. |
| 2021/0242030 A1 | 8/2021 | Shinoda et al. |
| 2021/0335625 A1 | 10/2021 | Kofuji et al. |

FOREIGN PATENT DOCUMENTS

| | | |
|---|---|---|
| JP | H03-012924 A | 1/1991 |
| JP | H03-218018 A | 9/1991 |
| JP | H04-180621 A | 6/1992 |
| JP | H04-225226 A | 8/1992 |
| JP | H04-298033 A | 10/1992 |
| JP | H05-07763 A | 1/1993 |
| JP | H05-234947 A | 9/1993 |
| JP | H06-045326 A | 2/1994 |
| JP | H06-053173 A | 2/1994 |
| JP | 106-077184 A | 3/1994 |
| JP | H07-254606 A | 10/1995 |
| JP | H08-107101 A | 4/1996 |
| JP | H09-185999 A | 7/1997 |
| JP | H10-335314 A | 12/1998 |
| JP | H11-185998 A | 7/1999 |
| JP | H11-340213 A | 12/1999 |
| JP | 2000-091321 A | 3/2000 |
| JP | 2000-306884 A | 11/2000 |
| JP | 2001-185542 A | 7/2001 |
| JP | 2001-319821 A | 11/2001 |
| JP | 2002-343768 A | 11/2002 |
| JP | 2003-229419 A | 8/2003 |
| JP | 2003-347278 A | 12/2003 |
| JP | 2004-349717 A | 12/2004 |
| JP | 2005-259839 A | 9/2005 |

(56) References Cited

FOREIGN PATENT DOCUMENTS

| | | | |
|---|---|---|---|
| JP | 2006-066905 A | 3/2006 | |
| JP | 2006-086449 A | 3/2006 | |
| JP | 2007-005491 A | 1/2007 | |
| JP | 2007-059567 A | 3/2007 | |
| JP | 2008-124190 A | 5/2008 | |
| JP | 2008-244146 A | 10/2008 | |
| JP | 2011-082180 A | 4/2011 | |
| JP | 2013-214583 A | 10/2013 | |
| JP | 2013-251546 A | 12/2013 | |
| JP | 2014-075578 A | 4/2014 | |
| JP | 2014-229751 A | 12/2014 | |
| JP | 2015-50362 A | 3/2015 | |
| JP | 2015-065434 A | 4/2015 | |
| JP | 2015-188025 A | 10/2015 | |
| JP | 2016-051846 A | 4/2016 | |
| JP | 2016-139792 A | 8/2016 | |
| JP | 2016-145412 A | 8/2016 | |
| JP | 2016-207771 A | 12/2016 | |
| JP | 2017-063186 A | 3/2017 | |
| JP | 2017-183688 A | 10/2017 | |
| JP | 2018-093226 A | 6/2018 | |
| JP | 2018-533207 A | 11/2018 | |
| JP | 2019-040932 A | 3/2019 | |
| JP | 2019-176184 A | 10/2019 | |
| JP | 2020-529732 A | 10/2020 | |
| JP | 2021-192464 A | 12/2021 | |
| KR | 10-2005-0099723 A | 10/2005 | |
| KR | 10-2008-0086172 A | 9/2008 | |
| KR | 10-2017-0101952 A | 9/2017 | |
| KR | 10-2017-0108916 A | 9/2017 | |
| TW | 544805 B | 8/2003 | |
| TW | 200620454 A | 6/2006 | |
| TW | 200802592 A | 1/2008 | |
| TW | 200829087 A | 7/2008 | |
| TW | 201234474 A | 8/2012 | |
| TW | 201417172 A | 5/2014 | |
| TW | 201428848 A | 7/2014 | |
| TW | 201517162 A | 5/2015 | |
| TW | 201533796 A | 9/2015 | |
| WO | 2005104203 A | 11/2005 | |
| WO | 2016121075 A1 | 8/2016 | |
| WO | 2016190036 A1 | 12/2016 | |
| WO | 2020161879 A1 | 8/2020 | |
| WO | 2020217266 A1 | 10/2020 | |

OTHER PUBLICATIONS

Written Opinion mailed Jul. 19, 2022 in International Application No. PCT/JP2022/018912.
Notice of Allowance mailed Feb. 16, 2022 in U.S. Appl. No. 16/216,455.
Office Action mailed Apr. 2, 2021 in U.S. Appl. No. 15/558,005.
Office Action mailed Apr. 29, 2021 in U.S. Appl. No. 16/216,455.
Office Action mailed Aug. 24, 2020 in U.S. Appl. No. 15/558,005.
Office Action mailed Dec. 9, 2019 in Korean Application No. 10-2018-0157894.
Office Action mailed Feb. 23, 2018 in Taiwanese Application No. 106123071.
Office Action mailed Feb. 28, 2023 in Japanese Application No. 2022-552363.
Office Action mailed Feb. 7, 2020 in U.S. Appl. No. 15/558,005.
Office Action mailed Jul. 21, 2020 in Japanese Application No. 2019-124995.
Office Action mailed Jun. 14, 2019 in U.S. Appl. No. 15/558,005.
Office Action mailed Mar. 5, 2019 in Japanese Application No. 2018-037128.
Office Action mailed May 12, 2022 in U.S. Appl. No. 15/558,005.
Office Action mailed May 6, 2022 in Taiwanese Application No. 111104241.
Office Action mailed Nov. 26, 2018 in U.S. Appl. No. 15/558,005.
Office Action mailed Nov. 30, 2022 in U.S. Appl. No. 15/558,005.
Office Action mailed Oct. 15, 2021 in U.S. Appl. No. 15/558,005.
Office Action mailed Sep. 28, 2018 in Taiwanese Application No. 106123071.
Search Report mailed Apr. 6, 2021 in International Application No. PCT/JP2021/004592.
Search Report mailed Jul. 5, 2016 in International Application No. PCT/JP2016/063129.
Search Report mailed Mar. 10, 2020 in International Application No. PCT/JP2019/050413.
Search Report mailed Mar. 12, 2019 in International Application No. PCT/JP2019/004577.
Search Report mailed Sep. 7, 2021 in International Application No. PCT/JP2021/024374.
Written Opinion mailed Apr. 6, 2021 in International Application No. PCT/JP2021/004592.
Written Opinion mailed Sep. 7, 2021 in International Application No. PCT/JP2021/024374.
Office Action mailed Apr. 20, 2021 in Japanese Application No. 2020-509124.
Patrick Verdonck, et al., "Analysis of the Etching Mechanisms of Tungsten in Fluorine Containing Plasmas", Journal of Electrochemical Society, vol. 142, No. 6, pp. 1971-1976 (1995).
Search Report mailed Jul. 16, 2019 in International Application No. PCT/JP2019/016930.
Office Action mailed Sep. 26, 2018 in Taiwanese Application No. 107106284.
Office Action mailed Jul. 13, 2018 in Korean Application No. 10-2014-0013325.
Office Action mailed Jul. 13, 2018 in Korean Application No. 10-2015-0053111.
Office Action mailed Aug. 9, 2016 in Japanese Application No. 2013-112562.
Office Action mailed Jan. 15, 2016 in Taiwanese Application No. 10520049730.
Office Action mailed Jan. 19, 2015 in Korean Application No. 10-2014-0013325.
Search Report mailed Oct. 7, 2014 in U.S. Appl. No. 14/177,251.
Notice of Allowance mailed Aug. 27, 2021 in U.S. Appl. No. 16/646,057.
Office Action mailed May 11, 2021 in U.S. Appl. No. 16/646,057.
Office Action mailed May 10, 2024 in Taiwanese Application No. 112106619.
Office Action mailed Aug. 16, 2023 in Taiwanese Application No. 112106619.

* cited by examiner

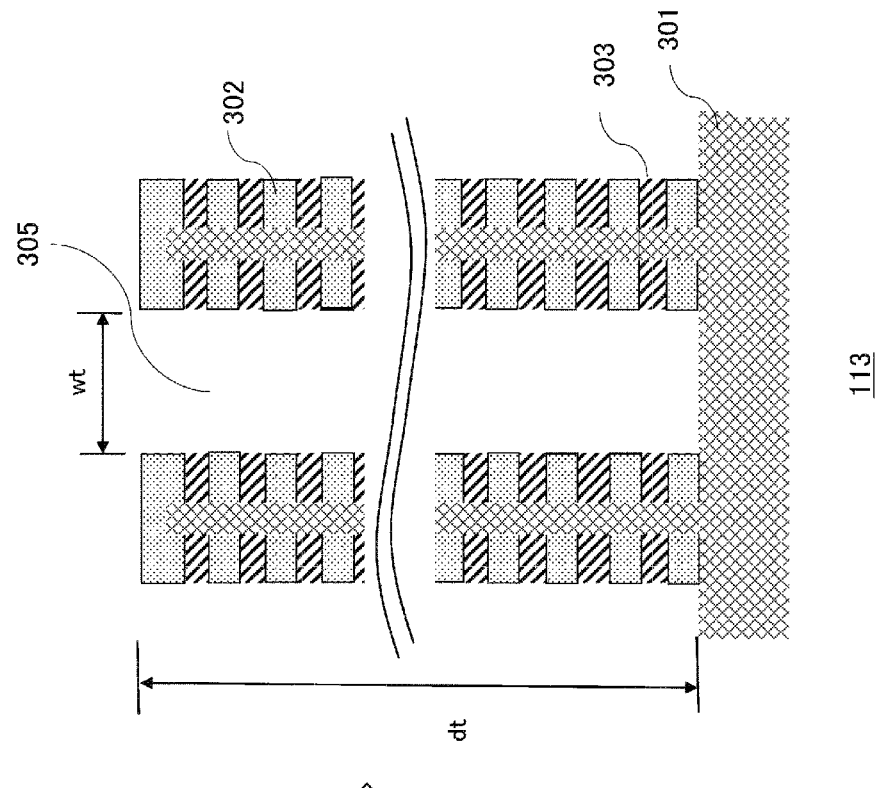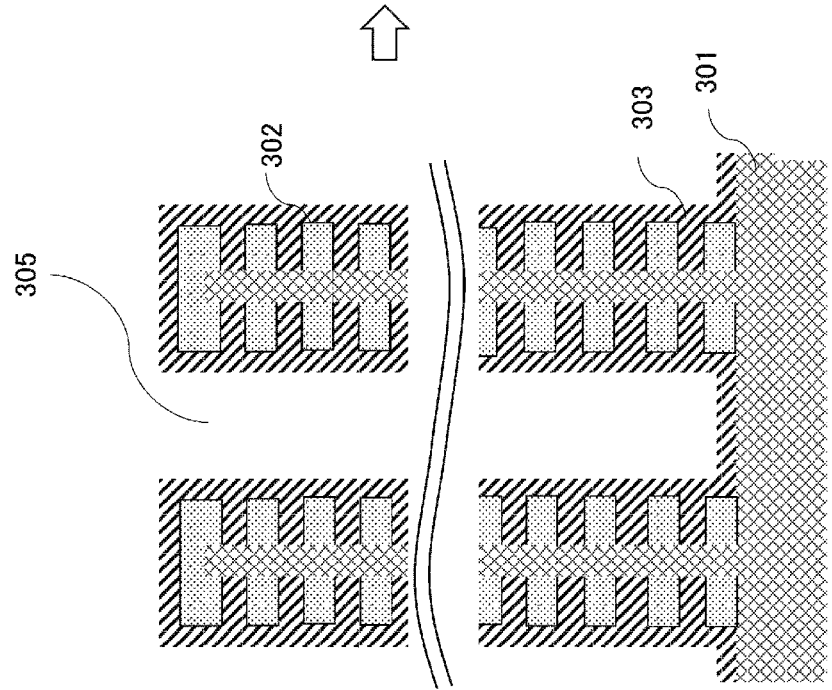

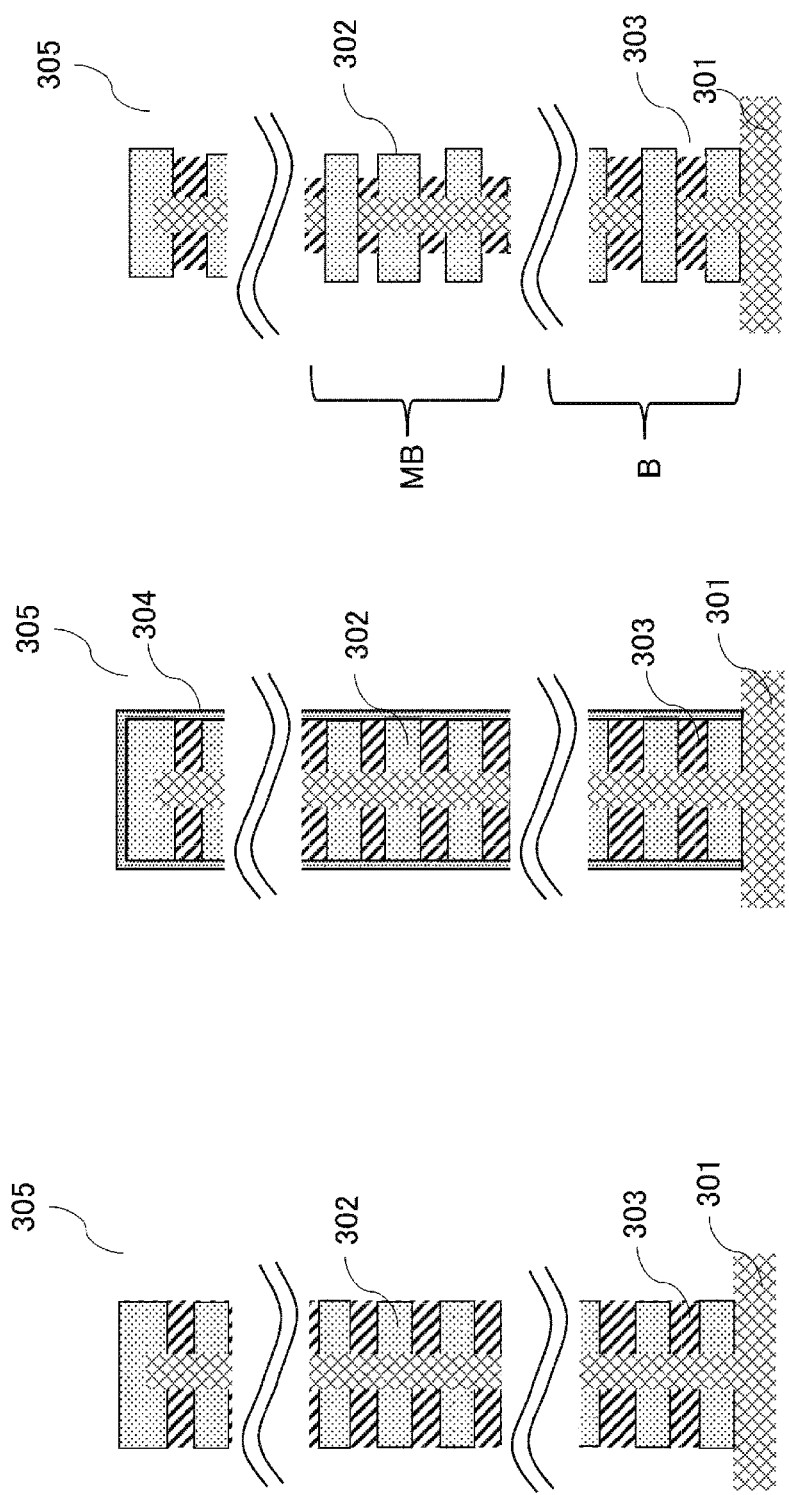

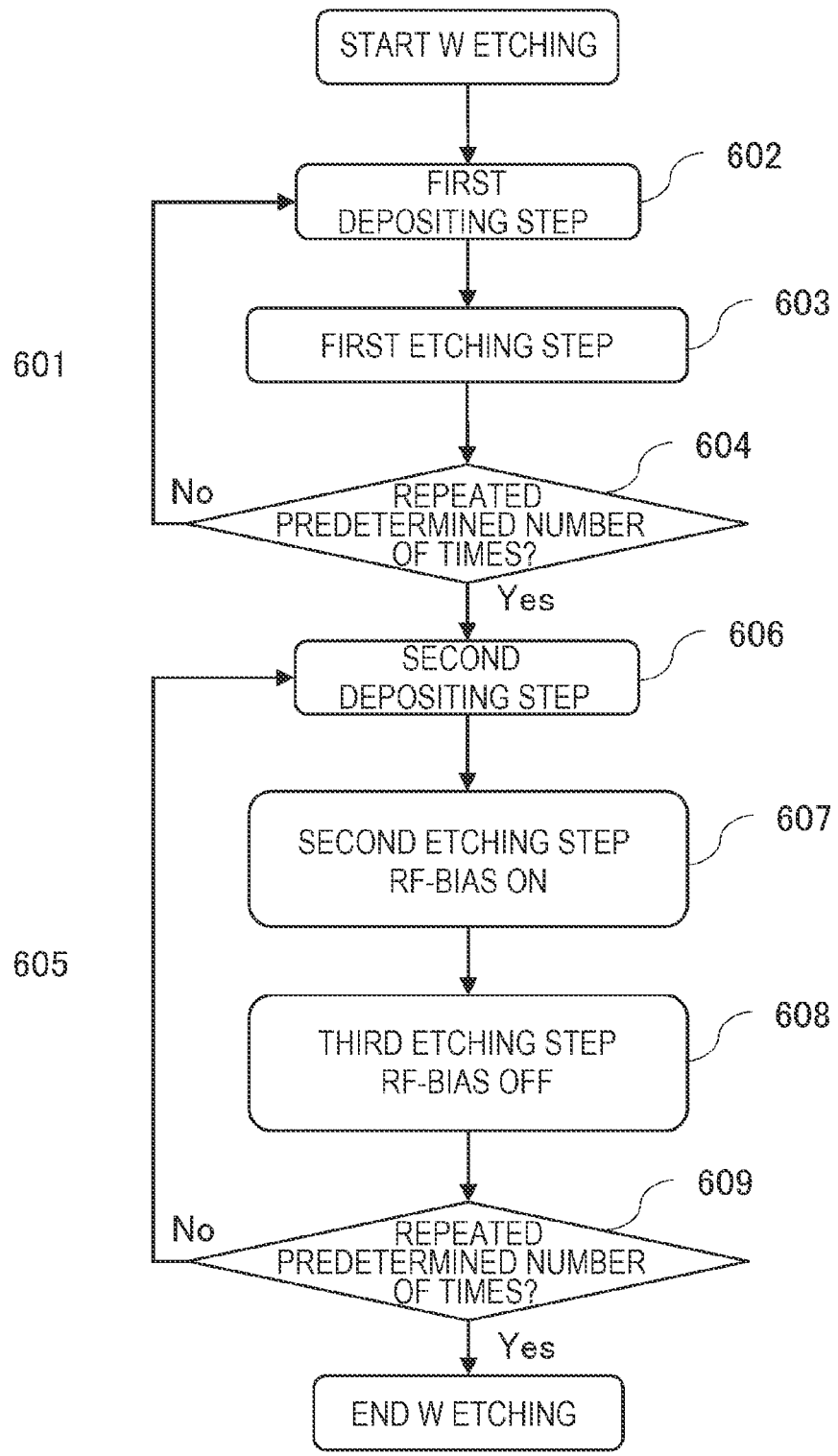

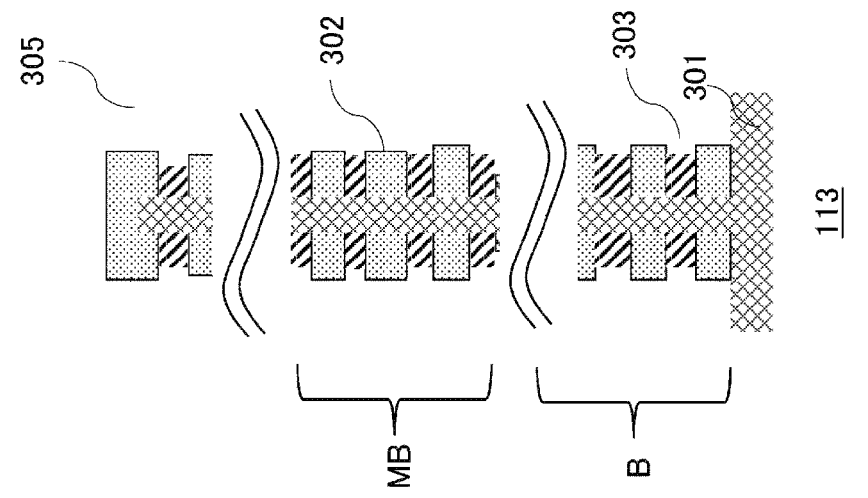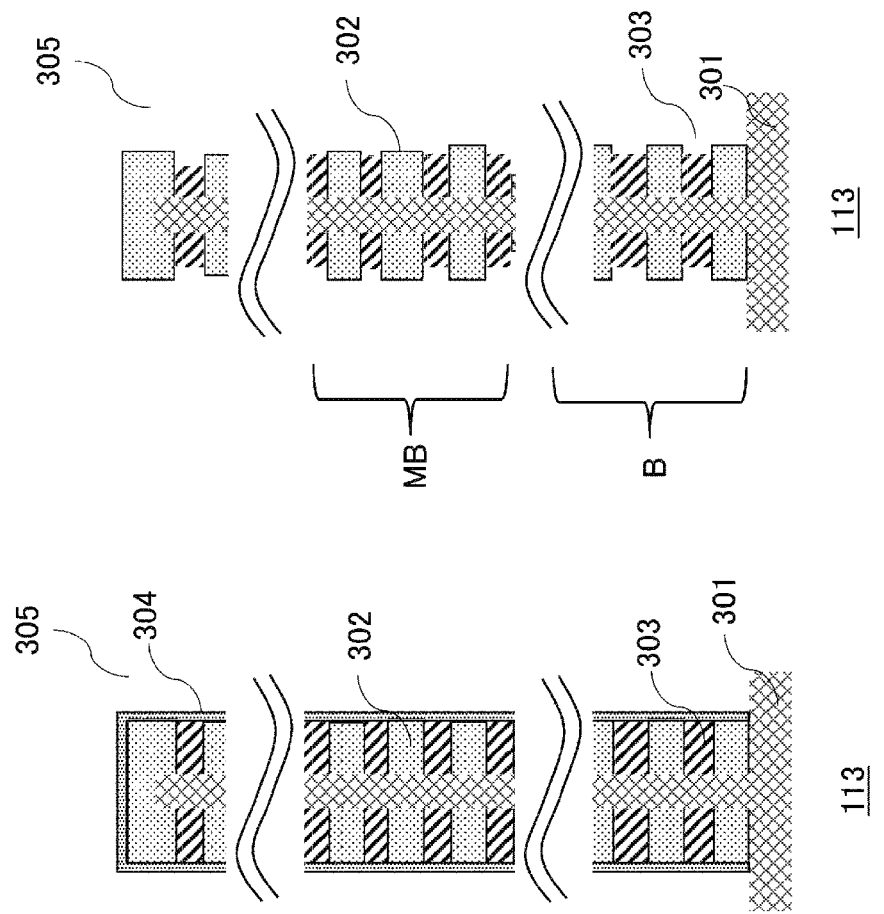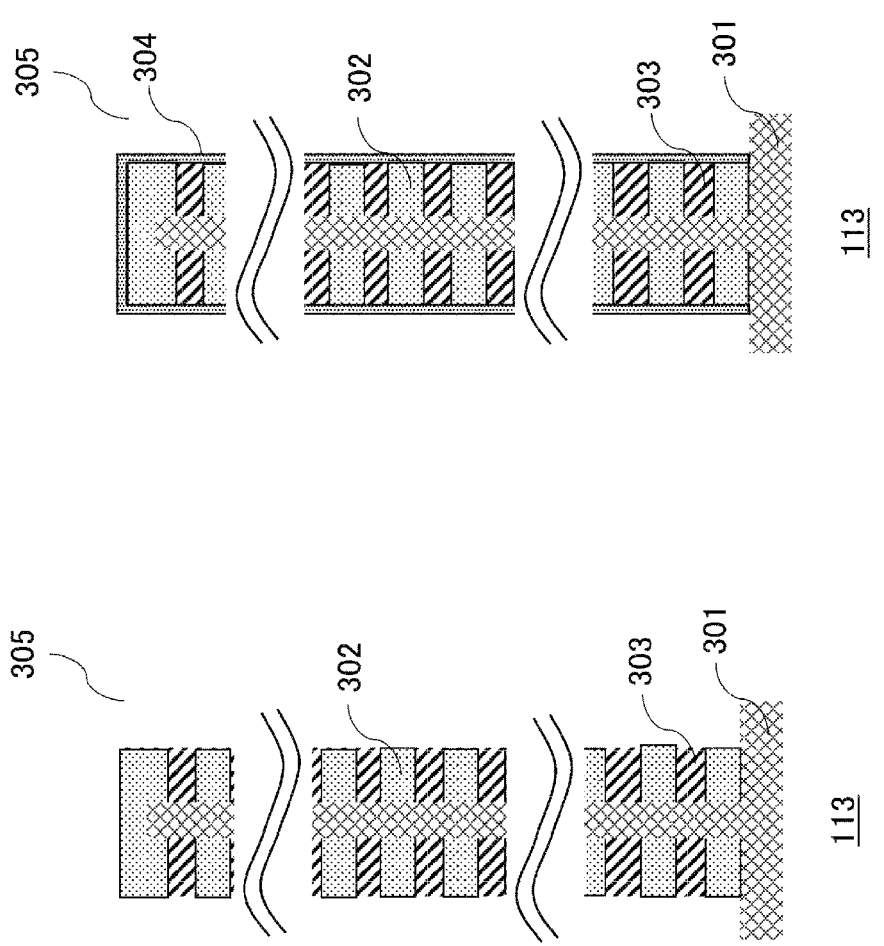

PLASMA PROCESSING METHOD

TECHNICAL FIELD

The present invention relates to a plasma processing method.

BACKGROUND ART

In recent years, in a NAND flash memory technology, a NAND flash memory having a three-dimensional structure (3D-NAND) in which memory cells are stacked in a vertical direction becomes mainstream.

In a manufacturing process of the NAND flash memory having a three-dimensional structure, first, a process of forming, along a trench (an etching groove) formed perpendicular to a wafer surface, a stacked structure in which an insulating film which is a silicon oxide ($SiO_2$) film or the like and a metal film (a gate electrode film) which is a tungsten (W) film or the like each are alternately overlapped 100 or more layers, is performed.

Next, an etching process of uniformly removing, by performing isotropic etching using plasma, the plurality of tungsten films, which are stacked in a trench depth direction, in a lateral direction that is a direction parallel to the wafer surface is performed.

As a method for uniformly etching tungsten in such a trench in the lateral direction, PTL 1 discloses a two-step processing method in which tungsten at a groove bottom is removed by performing anisotropic etching and then tungsten on side surfaces is isotropically removed.

Specifically, in the anisotropic etching step, ions are perpendicularly incident on a sample to remove the tungsten at the groove bottom by generating plasma and applying radio frequency power to the sample. Regarding the isotropic etching, a method of generating plasma and performing processing without applying a radio frequency bias to a sample is disclosed.

CITATION LIST

Patent Literature

PTL 1: JP2019-176184A

SUMMARY OF INVENTION

Technical Problem

In a next-generation technology, higher integration is required, and it is necessary to handle a stacked structure in which the number of stacked layers is 200 layers or more and a depth of a trench is 12 µm or more. In the trench in such a stacked structure, a tungsten film is located at a position deeper than that in the trench in the related art. Therefore, it is difficult to achieve sufficient and uniform etching by the etching method disclosed in PTL 1.

Therefore, an object of the invention is to provide a plasma processing method capable of uniformly removing a film that is a processing target in a lateral direction even when a depth of a trench is increased.

Solution to Problem

The invention provides a plasma processing method for plasma-etching a tungsten film of a stacked film formed by alternately stacking an insulating film and the tungsten film, the method includes: a first depositing step of depositing a deposited film; a first etching step of etching the tungsten film after the first depositing step; a second depositing step of depositing a deposited film; a second etching step of etching the tungsten film by using a mixed gas containing a $Cl_2$ gas, an $N_2$ gas, a $CF_4$ gas and a $C_4F_8$ gas after the second depositing step; and a third etching step of etching the tungsten film after the second etching step, the second depositing step is performed after the first depositing step and the first etching step are repeated a predetermined number of times, and the second depositing step, the second etching step, and the third etching step are repeated a predetermined number of times.

Advantageous Effects of Invention

According to the invention, it is possible to uniformly remove a film that is a processing target in a lateral direction even when a depth of a trench is increased.

Problems, configurations, and effects other than those described above become obvious from the following description of embodiments.

BRIEF DESCRIPTION OF DRAWINGS

FIGS. 3A and 3B are schematic diagrams illustrating stacked structures before processing and after the processing in a first cycle.

FIGS. 4A-4C are schematic diagrams illustrating a state where a second cycle in the related art is applied to a second stacked structure.

FIG. 6 is a flowchart of a plasma processing method according to the embodiment.

FIGS. 7A-7C are schematic diagrams illustrating a state where a second cycle according to the embodiment is applied to the second stacked structure.

DESCRIPTION OF EMBODIMENTS

Figure 1:
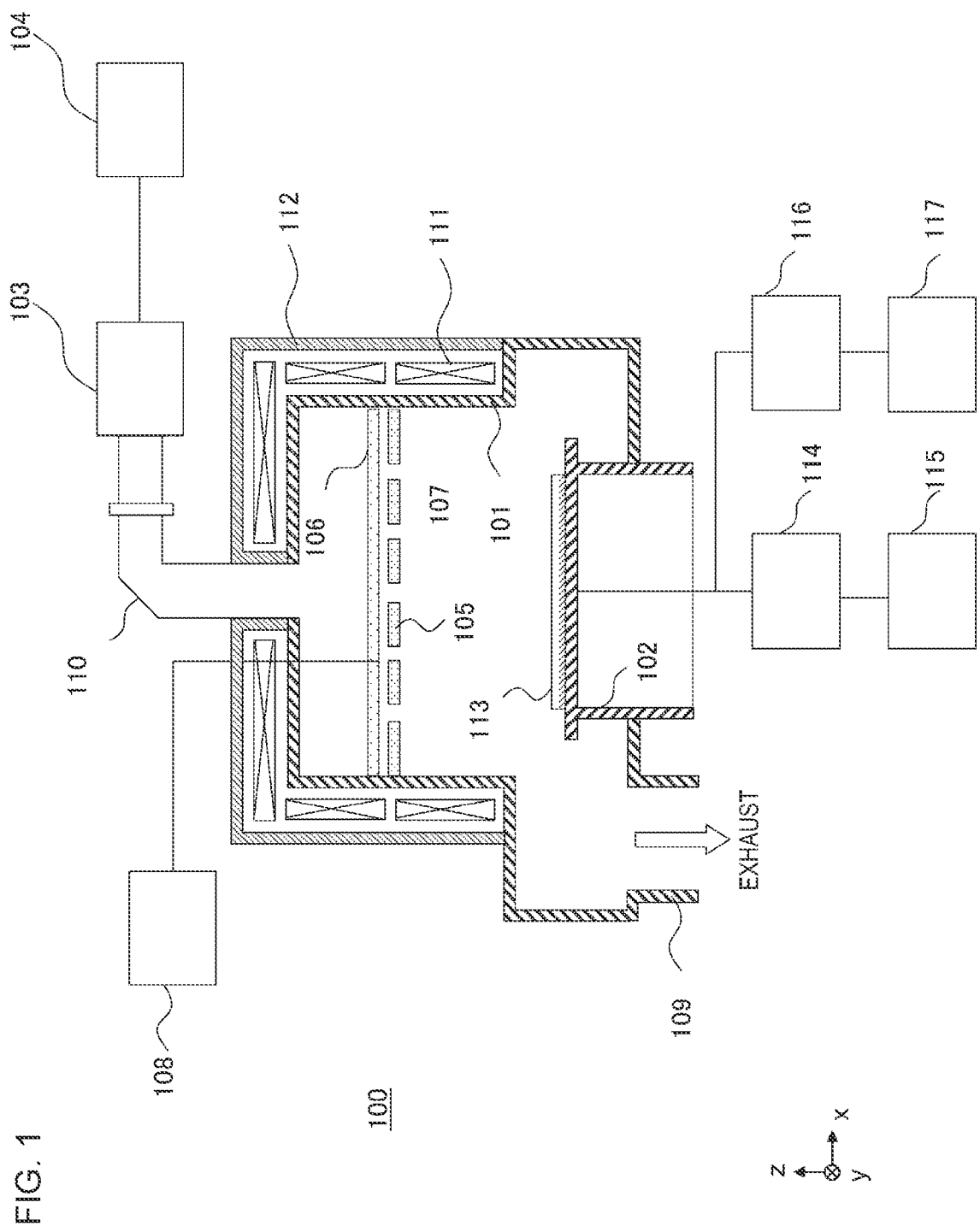
FIG. 1 is a diagram illustrating a plasma processing apparatus according to an embodiment.

Hereinafter, an embodiment of the invention will be described with reference to the drawings. The invention is not limited to the embodiment. Further, in the description of the drawings, the same parts are designated by the same reference numerals.

In order to facilitate understanding of the invention, a position, a size, a shape, a range, or the like of each component shown in the drawings may not represent an actual position, size, shape, range, or the like. Therefore, the invention is not necessarily limited to the position, size, shape, range, or the like illustrated in the drawings.

In the disclosure, each of directions indicated by an x axis, a y axis, and a z axis described in the drawings may be used to indicate a direction. Terms "upward" and "downward" may be referred to as a "z-axis plus direction" and a "z-axis minus direction", and a horizontal direction may be referred to as an "x-axis direction", a "y-axis direction", and a "lateral direction".

Further, a length in a z-axis direction is referred to as "height" or "depth", and a length on a xy plane defined by an x-axis direction and the y-axis direction is referred to as "width".

<Description of Plasma Processing Apparatus>

Hereinafter, a plasma processing apparatus according to an embodiment of the invention will be described with reference to FIG. 1. FIG. 1 is a diagram illustrating the plasma processing apparatus according to the present embodiment. In the present embodiment, an electron cyclotron resonance (ECR) microwave plasma etching apparatus is shown as an example of the plasma processing apparatus.

In a plasma processing apparatus 100, a shower plate 105 (for example, made of quartz) for introducing a processing gas into a vacuum container 101 and a dielectric window 106 (for example, made of quartz) are provided in the vacuum container 101. A sealed space below the dielectric window 106 forms a processing chamber 107. A plurality of holes for supplying the processing gas are disposed in the shower plate 105, and a gas supplied from a gas supply device 108 is introduced into the processing chamber 107 through the plurality of holes. In addition, a vacuum exhaust device (not shown) is connected to the vacuum container 101 via a vacuum exhaust port 109.

A waveguide 110 is provided above the dielectric window 106, and transmits an electromagnetic wave for generating plasma to the processing chamber 107. A radio frequency wave (a radio frequency wave for plasma generation) to be transmitted to the waveguide 110 is output from an oscillator 103 controlled by a first radio frequency power supply 104. Further, the first radio frequency power supply 104 includes a pulse oscillator, and can output a time-modulated intermittent radio frequency wave or a continuous radio frequency wave. A frequency of the radio frequency wave is not particularly limited, and in the present embodiment, a microwave of 2.45 GHZ (the radio frequency wave for plasma generation) is used.

A magnetic field generating coil 111 for generating a magnetic field is provided at an outer peripheral portion of the processing chamber 107. Plasma is generated in the processing chamber 107 by an interaction between the magnetic field generated by the magnetic field generating coil 111 and the electromagnetic wave introduced from the waveguide 110. The magnetic field generating coil 111 is covered by a coil case 112.

A sample stage 102 is provided at a position that faces the shower plate 105 and at a lower portion of the vacuum container 101. A surface of an electrode provided on the sample stage 102 is coated with a thermal sprayed film (not shown), and the electrode is connected to a direct current power supply 117 via a radio frequency filter 116. Further, a second radio frequency power supply 115, which is a radio frequency power supply for bias, is connected to the sample stage 102 via a matching circuit (a matching) device) 114. A temperature controller (not shown) is connected to the sample stage 102. A wafer 113 is conveyed into the processing chamber 107 of the vacuum container 101 by a conveying unit (not shown) and is placed on the sample stage 102.

The wafer 113 conveyed into the processing chamber 107 is adsorbed on the sample stage 102 by an electrostatic force caused by a direct current voltage applied from the direct current power supply 117, and a temperature of the wafer 113 is adjusted. After a desired processing gas is supplied into the processing chamber 107 by the gas supply device 108, the inside of the vacuum container 101 is controlled to a predetermined pressure via the vacuum exhaust device, and plasma is generated in the processing chamber 107 based on the radio frequency wave supplied from the oscillator 103. By applying radio frequency power (RF-bias) from the second radio frequency power supply 115 connected to the sample stage 102, ions are drawn from the plasma to the wafer 113, and the wafer 113 is plasma-processed (etched). Further, since the second radio frequency power supply 115 includes a pulse oscillator, it is possible to supply (apply) time-modulated intermittent radio frequency power or continuous radio frequency power to the sample stage 102.

[Plasma Processing Method in the Related Art]

Figure 2:
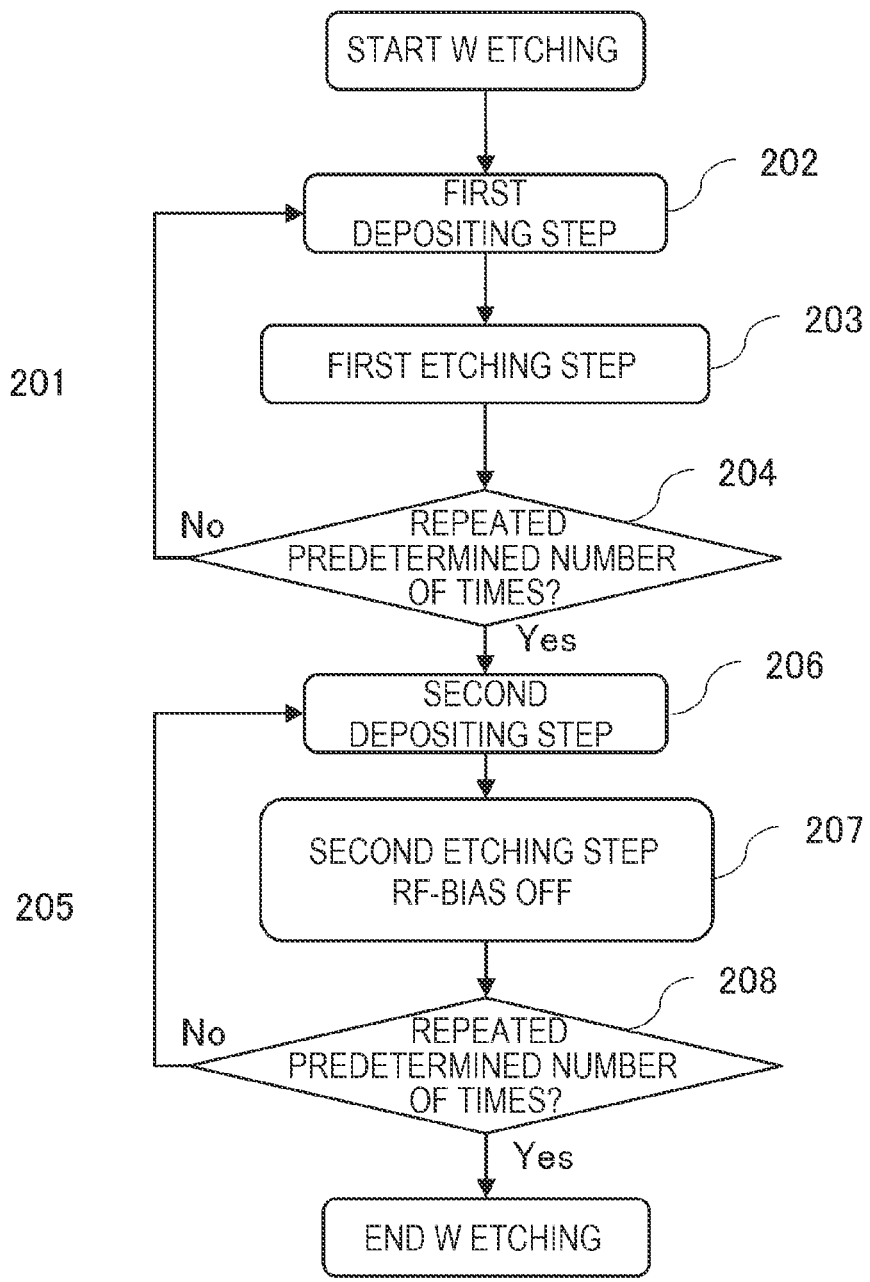
FIG. 2 is a flowchart of a plasma processing method in the related art.

First, a case where a plasma processing method in the related art is applied will be described. FIG. 2 is a flowchart of the plasma processing method in the related art. A series of processing steps according to the plasma processing method includes a first cycle 201 to be applied to a stacked structure of a wafer in a predetermined processing stage (hereinafter, referred to as a "first stacked structure"), and a second cycle 205 to be applied to the stacked structure in a stage where the first cycle 201 is performed (hereinafter, referred to as a "second stacked structure"). Each cycle will be described below.

Table 1 shows conditions of each processing step in the flowchart illustrated in FIG. 2. In Table 1, items "Ar", "He", "$CF_4$", "$CHF_3$", "$Cl_2$", "$N_2$", "$CH_2F_2$", and "$C_4F_8$" indicate types and flow rates of gases supplied by the gas supply device 108. An item "pressure" indicates a pressure value set in the vacuum container 101. An item "microwave" indicates power of the microwave (the radio frequency wave for plasma generation) output by the first radio frequency power supply 104 and transmitted through the waveguide 110. An item "RF-bias" indicates conditions (power (W), frequency (Hz), duty (%) of the radio frequency power applied from the second radio frequency power supply 115 to the wafer. An item "time" indicates a time (second(s)) during which the processing step is performed.

TABLE 1

|  |  | Ar | He | $CF_4$ | $CHF_3$ | $Cl_2$ | $N_2$ | $CH_2F_2$ | $C_4F_8$ |
|---|---|---|---|---|---|---|---|---|---|
|  |  | (ml/min) | | | | | | | |
| First | First depositing step | 290 | 290 | — | 10 | — | — | — | 12 |
| cycle | First etching step | 150 | 162 | 100 | — | 50 | 30 | — | 9 |
| Second | Second depositing step | 290 | 290 | — | 10 | — | — | 5 | 12 |

TABLE 1-continued

| | | Pressure (Pa) | Microwave (W) | RF-bias Power (W) | RF-bias Frequency (Hz) | RF-bias Duty (%) | Time (S) |
|---|---|---|---|---|---|---|---|
| cycle | Second etching step (RF-bias OFF) | 150 | 162 | 75 | — | 30 30 | — 10 |
| First cycle | First depositing step | 6 | 400 | 100 | 1000 | 22 | 18 |
| | First etching step | 5.9 | 700 | 0 | — | — | 58.5 |
| Second cycle | Second depositing step | 6 | 400 | 100 | 1000 | 22 | 15 |
| | Second etching step (RF-bias OFF) | 6.1 | 700 | 0 | — | — | 63.5 |

<First Cycle 201>

FIGS. 3A and 3B are schematic diagrams illustrating stacked structures before processing and after the processing in the first cycle 201.

Here, FIG. 3A shows the first stacked structure before the processing in the first cycle 201 is performed. The wafer 113 is a sample including a stacked film formed by alternately stacking an insulating film and a tungsten film. The wafer 113 includes a substrate made of polycrystalline silicon 301 and cores (channels) standing upright on the substrate. At least 200 layers of silicon oxide films 302 and at least 200 layers of tungsten films 303 are alternately stacked along the cores on the polycrystalline silicon 301, and further the tungsten films 303 also cover a surface of the wafer 113 so as to surround the layers of the silicon oxide films 302. A trench 305 that is a groove structure is formed on the wafer 113. The stacked structure is not limited to the silicon oxide films and the tungsten films as long as the stacked structure is a structure in which an insulating film and a metal film are alternately stacked along the trench.

FIG. 3B shows the second stacked structure when the processing in the first cycle 201 is performed. The first cycle 201 includes a first depositing step 202 of depositing a deposited film, and a first etching step 203 of etching the tungsten films in the stacked film after the first depositing step 202, and the first depositing step 202 and the first etching step 203 are repeated a predetermined number of times. For the tungsten films 303, a part surrounding the layers of the silicon oxide films 302 and covering the surface of the wafer 113 is removed, and the stacked structure is exposed along side walls of the trench 305.

In the present embodiment, when a depth of the trench 305 (a length from an uppermost portion to a lowermost portion of the stacked structure) is set to dt and a width is set to wt, it is also possible to set dt to 15.2 µm or more, and set wt to 134.5 nm or less. In addition, it is also possible to set dt to 11.7 µm or more and set wt to 160 nm or less. When an aspect ratio is set to dt/wt, the aspect ratio of the former is 113, and the aspect ratio of the latter is 73. A relation between the depth and the width of the trench 305 is not limited thereto. Further, the stacked structure shown in FIGS. 3A and 3B are not limited thereto.

When the total number of the tungsten films 303 is set to 344, from one tungsten film 303 at a deepest portion of the trench 305 (hereinafter, referred to as the "lowermost layer"), 1st to 10th layers are referred to as a Bottom portion (a B portion), 84th to 93rd layers are referred to as a Middle-Bottom portion (an MB portion), 168th to 177th layers are referred to as a Middle portion (a M portion), 251st to 260th layers are referred to as a Top-Middle portion (a TM portion), and 335th to 344th layers are referred to as a Top portion (a T portion) for the sake of convenience.

When a positional relation of each portion is expressed by a ratio of the number of accumulated layers counted from the lowermost layer to the total number of layers, the B portion corresponds to 0% to 3%, the MB portion corresponds to 24% to 27%, the M portion corresponds to 49% to 51%, the TM portion corresponds to 73% to 76%, and the T portion corresponds to 978 to 100%. As described above, when uniformity of the etching amount of the tungsten films 303 with respect to the depth of the trench 305 is evaluated, a value of the etching amount in predetermined layers (the B portion) including a layer corresponding to 0% (the lowermost layer) with the lowermost layer as a reference, a value of the etching amount in predetermined layers (the MB portion) including a layer corresponding to 25%, a value of the etching amount in predetermined layers (the M portion) including a layer corresponding to 508, a value of the etching amount in predetermined layers (the TM portion) including a layer corresponding to 75%, and a value of the etching amount in predetermined layers (the T portion) including a layer corresponding to 100% may be used (the predetermined layers includes, for example, 10 layers). However, the invention is not limited thereto, and the number of layers and the position of each portion and the number of the predetermined layers can be set as appropriate.

In the first depositing step 202, the supplied gases are, as shown in Table 1, an Ar gas at a supply rate of 290 ml/min, an He gas at a supply rate of 290 ml/min, a $CHF_3$ gas at a supply rate of 10 ml/min, and a $C_4F_8$ gas at a supply rate of 12 ml/min. The pressure in the vacuum container 101 is 6 Pa, the microwave for plasma generation is 400 W, the radio frequency power applied to the wafer is 100 W, 1000 Hz, 22%, and a time for the first depositing step 202 is 18 s.

In the first depositing step 202, a deposited film, which contains fluorocarbon containing $CH_xF_y$ gas as a main component, is formed on an inner surface of the trench 305. The first depositing step 202 achieves an adjustment function of adjusting the balance between an amount of fluorine radicals, which serve as an etchant, and an amount of the deposited film, to make the etching progress at the same rate along a depth direction from the T portion to the B portion in the trench 305. In the following description, the deposited film containing fluorocarbon may be referred to as a protective film.

Similarly, in the first etching step 203, the supplied gases are an Ar gas at a supply rate of 150 ml/min, an He gas at a a supply rate of 162 ml/min, a $CF_4$ gas at a supply rate of 100 ml/min, a $Cl_2$ gas at a supply rate of 50 ml/min, an $N_2$ gas at a supply rate of 30 ml/min, and a $C_4F_8$ gas at a supply rate of 9 ml/min. The pressure in the vacuum container 101 is 5.9 Pa, and the microwave for plasma generation is 700 W. No radio frequency power is applied to the wafer. A time for the first etching step 203 is 58.5 S.

In a repetition determination step 204, it is determined whether the first depositing step 202 and the first etching step 203 are repeated the predetermined number of times. When it is determined that the predetermined number of times is not reached, the process returns to the first depositing step 202. When it is determined that the predetermined number of times is reached, the first cycle 201 ends, and the process proceeds to a second depositing step 206 of the second cycle 205.

<Second Cycle 205>

FIGS. 4A-4C are schematic diagrams illustrating a state where the second cycle 205 in the related art is applied to the second stacked structure.

Here, (FIG. 4A shows the second stacked structure when the first cycle 201 ends (see FIG. 3B).

In the second depositing step 206, the supplied gases are, as shown in Table 1, an Ar gas at a supply rate of 290 ml/min, an He gas at a supply rate of 290 ml/min, a $CHF_3$ gas at a supply rate of 10 ml/min, a $CH_2F_2$ gas at a supply rate of 5 ml/min, and a $C_4F_8$ gas at a supply rate of 12 ml/min. The conditions including the items "pressure", "microwave", and "RF-bias" are the same as the conditions for the first depositing step 202 of the first cycle 201. A time for the second depositing step 206 is 15 s.

FIG. 4B shows a state when the second depositing step 206 of the second cycle 205 is applied. By the second depositing step 206, a protective film 304, which contains fluorocarbon containing the $CH_xF_y$ gas as a main component, is formed on surfaces of the silicon oxide films 302 and the tungsten films 303. The second depositing step 206 corresponds to the first depositing step 202 of the first cycle.

Similarly, in a second etching step (RF-bias OFF) 207 (hereinafter, also simply referred to as a "second etching step 207"), the supplied gases are an Ar gas at a supply rate of 150 ml/min, an He gas at a supply rate of 162 ml/min, a $CF_4$ gas at a supply rate of 75 ml/min, a $Cl_2$ gas at a supply rate of 30 ml/min, an $N_2$ gas at a supply rate of 30 ml/min, and a $C_4F_8$ gas at a supply rate of 10 ml/min. The pressure in the vacuum container 101 is 6.1 Pa, the microwave for plasma generation is 700 W, and no radio frequency power is applied to the wafer. A time for the second etching step 207 is 63.5 s.

A repetition determination step 208 is similar to the repetition determination step of the first cycle 201. FIG. 4C is a schematic diagram of the stacked structure when the second cycle 205 is performed four times in the order of the second depositing step 206 and the second etching step (RF-bias OFF) 207. As a result, the protective film 304 is removed, and the etching in a lateral direction of the tungsten films 303 progresses. However, as will be described later, there is a variation in the etching amount in the depth direction of the trench 305, and as a result, the etching amount at the MB portion is the largest and the etching amount at the B portion is the smallest.

Results and Considerations

Figure 5:
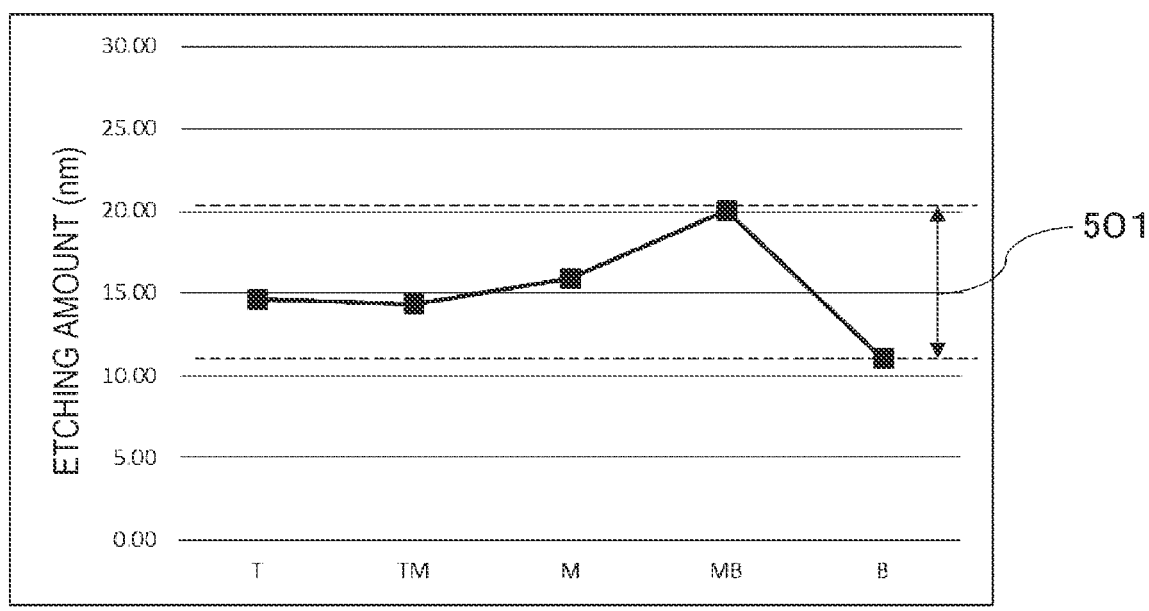
FIG. 5 is a diagram illustrating a relation between a depth of a trench and an etching amount in a plasma processing method in the related art.

A result and a problem obtained by processing the stacked structure according to the plasma processing method in the related art described above will be described. FIG. 5 is a diagram illustrating a relation between the depth of the trench 305 and the etching amount in the plasma processing method in the related art. The etching amount of the tungsten films 303 at 5 locations, that is, the B portion, the MB portion, the M portion, the TM portion, and the T portion in the depth direction of the trench 305 has a maximum value of 20.01 nm at the MB portion and a minimum value of 11.03 nm at the B portion. A difference 501 between the maximum value and the minimum value of the etching amount in the trench depth direction (hereinafter, referred to as the "etching amount difference" unless otherwise specified) is 8.98 nm, which exceeds an allowable value of 4 nm. Here, the etching amount at each portion is displayed by using an average value of the 10 layers. As a criterion for evaluation, the allowable value of the etching amount difference is set to 4 nm or less. Note that 4 nm corresponds to about 3% of the width wt of the trench.

A reason why the value of the etching amount difference 501 is increased and a distribution of the etching amount deteriorates will be considered. In a structure in which the depth of the trench 305 is 12 μm or more, the etchant that contributes to the etching reaches the MB portion, but the etchant does not reach the B portion at a sufficient amount. As a result, it is considered that a recess amount at the B portion where the etching is hardly performed is smaller than that of other portions.

In addition, a reaction product generated when the etching progresses is moved upward in the trench 305 and reacts with the etchant. Since the etchant is consumed by such a reaction, it is considered that the progress of the etching is suppressed. From the T portion to the M portion, since the reaction product generated from a downward direction in the trench 305 is supplied, the progress of the etching may be appropriately suppressed, while in the MB portion, the etchant is small in amount in the lower B portion, the reaction product is also small in amount, and the supply of the reaction product to the MB portion is also small. Therefore, it is considered that the etching progresses excessively without being suppressed in the MB portion where the supply of the reaction product is small, and the etching amount difference between the MB portion and the B portion became worse.

[Plasma Processing Method of the Present Embodiment]

Next, a plasma processing method according to the present embodiment will be described. FIG. 6 is a flowchart of the plasma processing method according to the present embodiment. The plasma processing method according to the present embodiment is different from the plasma processing method in the related art described above in that a second etching step (RF-bias ON) 607 (hereinafter, also simply referred to as the "second etching step") is provided in a second cycle 605. In other respects, the plasma processing method includes the same steps as those of the plasma processing method in the related art in FIG. 2. That is, a first depositing step 602, a first etching step 603, and a repetition determination step 604 of a first cycle 601 correspond to the first depositing step 202, the first etching step 203, and the repetition determination step 204 of the first cycle 201 of the plasma processing method in the related art shown in FIG. 2. Further, a second depositing step 606, a third etching step (RF-bias OFF) 608, and a repetition determination step 609 of the second cycle 605 correspond to the second depositing step 206, the second etching step (RF-bias OFF) 207, and the repetition determination step 208 of the second cycle 205 of the plasma processing method in the related art shown in FIG. 2. In the following description, the same or equivalent components as those of the plasma processing method in the related art described above are denoted by the same reference numerals, and the description thereof will be simplified or omitted.

Table 2 shows conditions for the second cycle 605 in the flowchart shown in FIG. 6. The second cycle 605 includes the second depositing step 606 of depositing a deposited film, the second etching step (RF-bias ON) 607 (hereinafter, also simply referred to as the "second etching step 607") of etching the tungsten films by using a mixed gas containing a $Cl_2$ gas, an $N_2$ gas, a $CF_4$ gas, and a $C_4F_8$ gas after the second depositing step 606, and the third etching step (RF-bias OFF) 608 (hereinafter, also simply referred to as the "third etching step 608") of etching the tungsten films after the second etching step 607, the second depositing step 606 is performed after the first cycle 601, and the second depositing step 606, the second etching step 607, and the third etching step 608 are repeated a predetermined number of times.

The second depositing step 606 is performed by using the $C_4F_8$ gas. The second depositing step 606 is performed under the same conditions as those for the second depositing step 206 of the second cycle 205 shown in FIG. 2.

plasma generation is 700 W, the radio frequency power (RF-bias) applied to the wafer is 20 W, and an application time is 5 s.

The third etching step (RF-bias OFF) 608 is a step of etching the tungsten films after the second etching step (RF-bias ON) 607, and is performed by using the mixed gas containing a $Cl_2$ gas, an $N_2$ gas, a $CF_4$ gas, and a $C_4F_8$ gas. Further, the third etching step (RF-bias OFF) 608 is performed without supplying the radio frequency power to the sample stage 102. In the third etching step (RF-bias OFF) 608, the conditions, that is, the supplied gases, the pressure, and the microwave are the same as those of the second etching step (RF-bias ON) 607 except that a step time is 58.5 s and no radio frequency power (RF-bias) is applied to the wafer.

Although the mixed gas containing the gases shown in Table 2 is shown as a gas containing fluorine used for the second etching step (RF-bias ON) 607 and the third etching step (RF-bias OFF) 608, the invention is not limited thereto. As the gas containing fluorine, a mixed gas containing at least one of an $NF_3$ gas and an $SF_6$ gas may be used. Further, an Ar gas and an He gas have a function of a dilution gas.

TABLE 2

| | | Ar | He | $CF_4$ | $CHF_3$ (ml/min) | $Cl_2$ | $N_2$ | $CH_2F_2$ | $C_4F_8$ |
|---|---|---|---|---|---|---|---|---|---|
| Second cycle | Second depositing step | 290 | 290 | — | 10 | — | — | 5 | 12 |
| | Second etching step (RF-bias ON) | 150 | 162 | 75 | — | 30 | 30 | — | 10 |
| | Third etching step (RF-bias OFF) | 150 | 162 | 75 | — | 30 | 30 | — | 10 |

| | | | | | RF-bias | | |
|---|---|---|---|---|---|---|---|
| | | Pressure (Pa) | Microwave (W) | Power (W) | Frequency (Hz) | Duty (%) | Time (S) |
| Second cycle | Second depositing step | 6 | 400 | 100 | 1000 | 22 | 15 |
| | Second etching step (RF-bias ON) | 6.1 | 700 | 20 | — | — | 5 |
| | Third etching step (RF-bias OFF) | 6.1 | 700 | 0 | — | — | 58.5 |

FIGS. 7A-7C are schematic diagrams illustrating a state where the second cycle 605 according to the present embodiment is applied to the second stacked structure. Since FIG. 7A and FIG. 7B are similar to FIG. 4A and FIG. 4B, the description thereof will be omitted. Further, FIG. 7C is a schematic diagram of the stacked structure when the second cycle 605 is performed a predetermined number of times in the order of the second depositing step 606, the second etching step (RE-bias ON) 607, and the third etching step (RF-bias OFF) 608. In the present embodiment, as shown in FIG. 7C, the variation in the etching amount at the MB portion and the B portion is suppressed.

Figure 8:
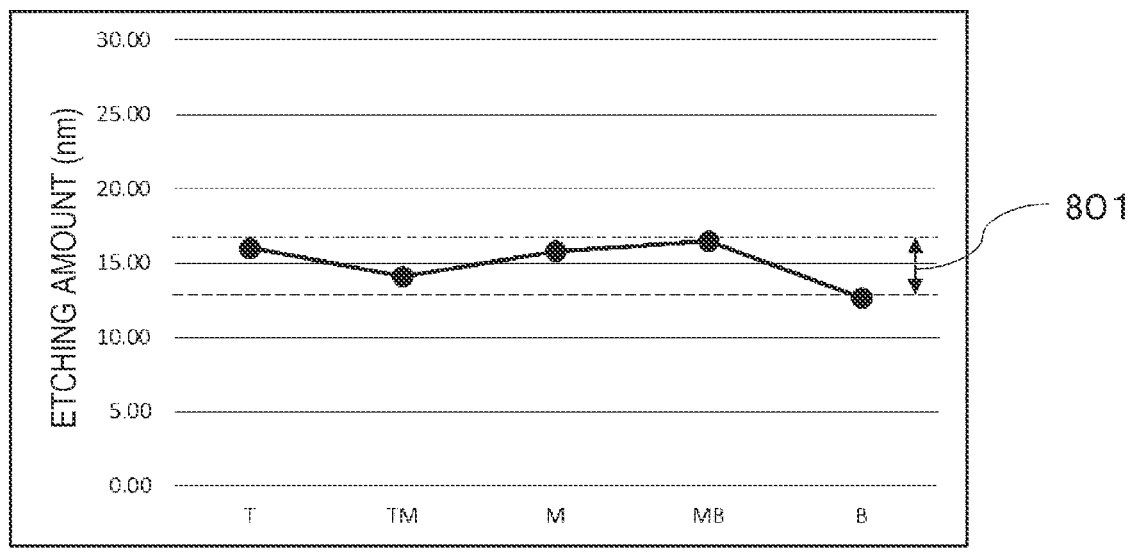
FIG. 8 is a diagram illustrating a relation between a depth of a trench and an etching amount in a plasma processing method according to the embodiment.

The second etching step (RF-bias ON) 607 is a step of etching the tungsten films by using the mixed gas containing a $Cl_2$ gas, an $N_2$ gas, a $CF_4$ gas, and a $C_4F_8$ gas. Further, the second etching step (RE-bias ON) 607 is performed while the radio frequency power is supplied to the sample stage 102 on which the sample having the stacked film is placed. As shown in Table 2, in the second etching step (RF-bias ON) 607, the supplied gases are an Ar gas at a supply rate of 150 ml/min, an He gas at a supply rate of 162 ml/min, a $CF_4$ gas at a supply rate of 75 ml/min, a $Cl_2$ gas at a supply rate of 30 ml/min, an $N_2$ gas at a supply rate of 30 ml/min, and a $C_4F_8$ gas at a supply rate of 10 ml/min. The pressure in the vacuum container 101 is 6.1 Pa, the microwave for FIG. 8 is a diagram illustrating a relation between the depth of the trench and the etching amount in the plasma processing method according to the present embodiment. The etching amount has a maximum value of 16.52 nm at the MB portion and a minimum value of 12.63 nm at the B portion. An etching amount difference 801 in the trench depth direction is 3.89 nm, and the distribution of the etching amount is improved.

Operations and Effects

It is considered that by providing the second etching step (RF-bias ON) 607 and appropriately applying the RF-bias (the radio frequency power) to the wafer, the ions are drawn into the trench 305 and a flow of the ions draws the etchant in the MB portion into the B portion. As a result, it is considered that the excessive etching amount at the MB portion is suppressed, while the etching amount at the B portion is increased, and the etching amount difference in the trench depth direction is reduced.

However, the application of the radio frequency power in the second etching step (RF-bias ON) 607 may excessively accelerate the etching of the protective film 304 containing fluorocarbon that adheres to the surface of the sample in the second depositing step 606, and may cause the etching on and damage the silicon oxide films 302 located on the surfaces of the stacked structure. Therefore, dependence of the power of the preferably usable radio frequency power and dependence of the application time was examined.

[Dependence of Power of Radio Frequency Power]

Figure 9:
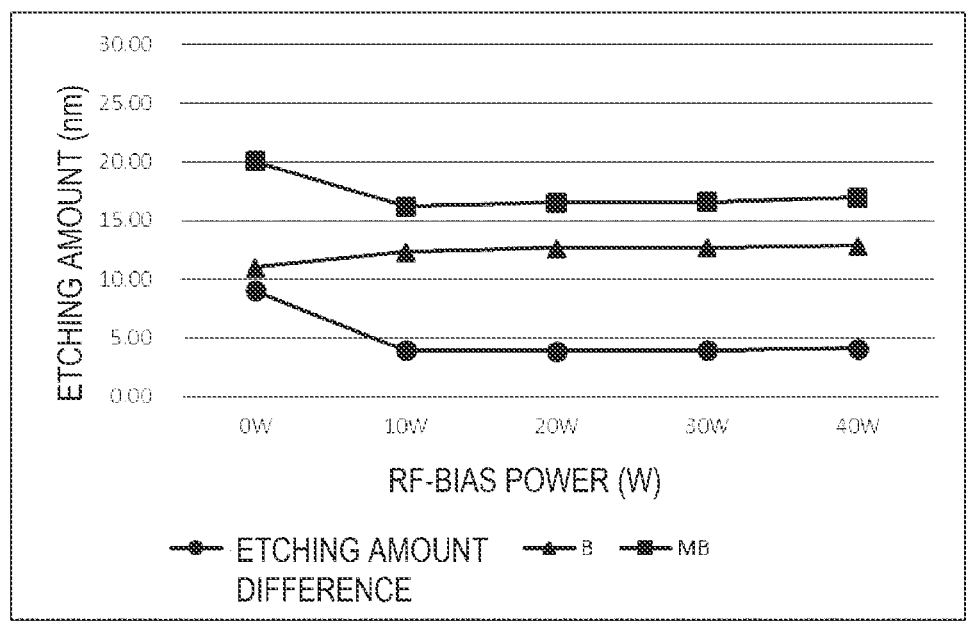
FIG. 9 is a diagram illustrating an etching amount difference when power of radio frequency power is changed from 0 W to 40 W.

First, the dependence of power of the radio frequency power was examined. Among the conditions in Table 2, the power of the radio frequency power in the second etching step (RF-bias ON) 607 was changed from 0 W to 40 W, and the plasma process was performed. FIG. 9 is a diagram illustrating the etching amount difference when the power of the radio frequency power was changed from 0 W to 40 W. Here, since the maximum value of the etching amount appears in the MB portion and the minimum value appears in the B portion from the T portion to the B portion, the MB portion and the B portion were selected as representative places for observing the dependence of power of the etching amount in FIG. 9. The power of the radio frequency power was changed to 0 W, 10 W, 20 W, 30 W, and 40 W, and the distribution of the etching amount was measured. As a result, the etching amount difference in the trench depth direction had a maximum value of 8.99 nm when the radio frequency power was 0 W. When the radio frequency power was increased from 0 W to 20 W, the etching amount difference was decreased, and when the radio frequency power was 20 W, the etching amount difference had a minimum value of 3.89 nm. When the radio frequency power was increased from 20 W to 40 W, the etching amount difference was increased, and when the radio frequency power was 40 W, the etching amount difference was 4.11 nm. From the above, it was found that the etching amount difference in the trench depth direction was 4 nm or less when the power of the radio frequency power was in a range of 10 W to 30 W, and the distribution of the etching amount was good. Further, it was confirmed that when the power of the radio frequency power was 40 W, the surface of the stacked structure was damaged. From the above, it was found that it is not desirable to use the power of 40 W or more for the radio frequency power. Accordingly, it is desirable to set the power of the radio frequency power in a range of 10 W to 30 W when the radio frequency power is applied for 5 s. When the radio frequency power is defined by an amount of power, it is also possible to say that the desirable radio frequency power is in a range of 50 W/s to 150 W/s.

[Dependence of Application Time of Radio Frequency Power]

Figure 10:
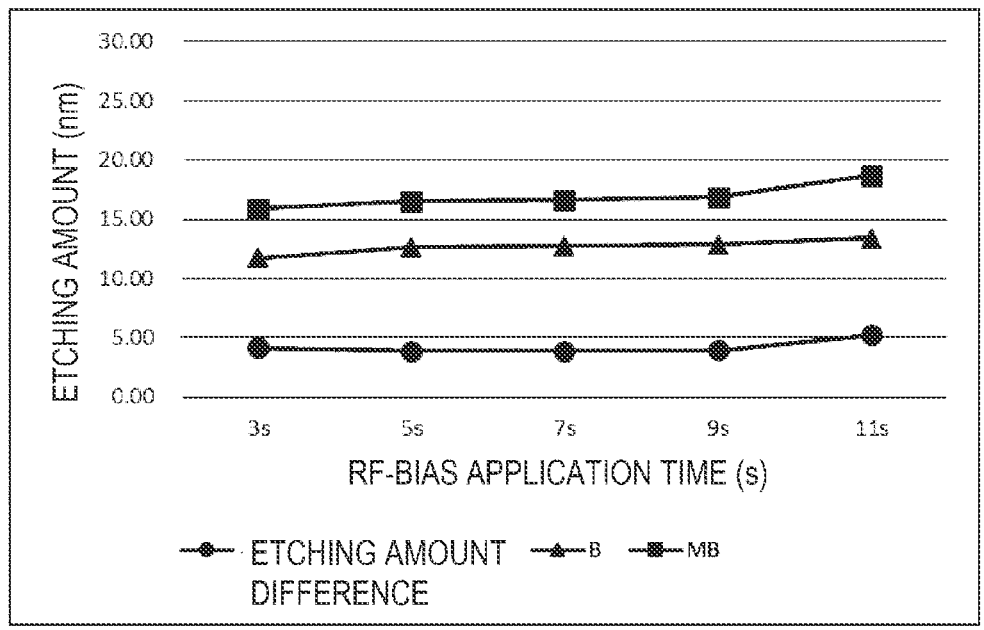
FIG. 10 is a diagram illustrating an etching amount difference when an application time of the radio frequency power is changed from 3 s to 11 s.

Next, the dependence of the application time of the radio frequency power was examined. Among the conditions in Table 2, the application time of the radio frequency power in the second etching step (RF-bias ON) 607 was changed from 3 s to 11 s, and the plasma process was performed. FIG. 10 is a diagram illustrating the etching amount difference when the application time of the radio frequency power is changed from 3 s to 11 s. Here, in the second cycle 605, the application time of the radio frequency power was changed to 3 s, 5 s, 7 s, 9 s, 11 s while keeping a total time of the second etching step (RF-bias ON) 607 and the third etching step (RF-bias OFF) 608 constant, and an experiment was conducted. For example, in a case where the total time was set to 63.5 s, the application time for step 608 was 60.5 S when the application time for step 607 was 3 s, the application time for step 608 was 58.5 s when the application time for step 607 was 5 s, the application time for step 608 was 56.5 s when the application time for step 607 was 7 s, the application time for step 608 was 54.5 s when the application time for step 607 was 9 s, and the application time for step 608 was 52.5 s when the application time for step 607 was 11 s. However, the total time is not limited to this value. This is because when a ratio of the time for the etching step in which the radio frequency power supply is turned ON (step 607) and is turned OFF (step 608) to the time for the second depositing step 606 is changed, the etching amount is also affected, and thus the total time of the etching step is kept constant, and the influence caused by the change in the application time of the radio frequency power supply is better grasped.

When the application time of the radio frequency power was changed from 3 s to 5 s, the etching amount difference in the trench depth direction was decreased from 4.17 nm to 3.89 nm which is the minimum value. When the application time is increased from 5 s to 11 s, the etching amount difference increases, and a maximum value of 5.25 nm is obtained in the case of 11 s. When the application time of the radio frequency power was changed from 5 s to 9 s, the etching amount difference in the trench depth direction was 4 nm or less. From the above, it was found that when the radio frequency power was applied at 20 W, the application time was desirably in the range of 5 s to 9 s. When the radio frequency power is expressed by the amount of power, it is also possible to say that the desirable radio frequency power is in a range of 100 W/s to 180 W/s.

Operations and Effects

In the experiments for the dependence of the power of the radio frequency power and the dependence of the application time, when the power was increased beyond the appropriate range of the radio frequency power and the application time was increased, the etching amount difference in the trench depth direction deteriorated. Considering a reason for the deterioration, when each of the output and the application time of the radio frequency power is within the appropriate range, an effect of drawing the etchant in the MB portion into the B portion is achieved. However, when the appropriate range is exceeded, a phenomenon also occurs in which the etchant existing between the T portion and the M portion is drawn into the MB portion. Therefore, an amount of the etchant in the MB portion increases, the etching progress more easily in the MB portion than in the B portion, and as a result, the etching amount difference is considered to be deteriorated.

[Time Modulation of Radio Frequency Power]

In order to further improve the distribution of the etching amount, time modulation (TM) of the microwave and the radio frequency power was attempted. The TM of the microwave and the radio frequency power is to use a time-modulated intermittent radio frequency power for the microwave and the radio frequency power. When an ON time (a time of output) of the time-modulated intermittent radio frequency power is set to $T_{ON}$ and an OFF time (a time with no output) is set to Torr, it is defined that the duty=$T_{ON}/(T_{ON}+T_{OFF})$. Conditions for the TM of the microwave and the radio frequency power were set such that the microwave for the second etching step (RF-bias ON) 607 and the third etching step (RF-bias OFF) 608 was set to 700 W, the frequency was set to 1000 Hz, the duty was set to 90%, the frequency of the radio frequency power for the second etching step (RF-bias ON) 607 was set to 1000 Hz, the duty was set to 30% and effective power was set to 20 W. The effective power is a product of the power and the duty. Detailed conditions for the second cycle 605 at that time are shown in Table 3.

TABLE 3

| | | Ar | He | $CF_4$ | $CHF_3$ | $Cl_2$ | $N_2$ | $CH_2F_2$ | $C_4F_8$ |
|---|---|---|---|---|---|---|---|---|---|
| | | | | | (ml/min) | | | | |
| Second cycle | Second depositing step | 290 | 290 | — | 10 | — | — | 5 | 12 |
| | Second etching step (RF-bias ON) | 150 | 162 | 75 | — | 30 | 30 | — | 10 |
| | Third etching step (RF-bias OFF) | 150 | 162 | 75 | — | 30 | 30 | — | 10 |

| | | | Microwave | | | RF-bias | | | |
|---|---|---|---|---|---|---|---|---|---|
| | | Pressure (Pa) | Power (W) | Frequency (Hz) | Duty (%) | Power (W) | Frequency (Hz) | Duty (%) | Time (S) |
| Second cycle | Second depositing step | 6 | 400 | — | — | 100 | 1000 | 22 | 15 |
| | Second etching step (RF-bias ON) | 6.1 | 700 | 1000 | 90 | 66.7 | 1000 | 30 | 5 |
| | Third etching step (RF-bias OFF) | 6.1 | 700 | 1000 | 90 | 0 | — | — | 58.5 |

Figure 11:
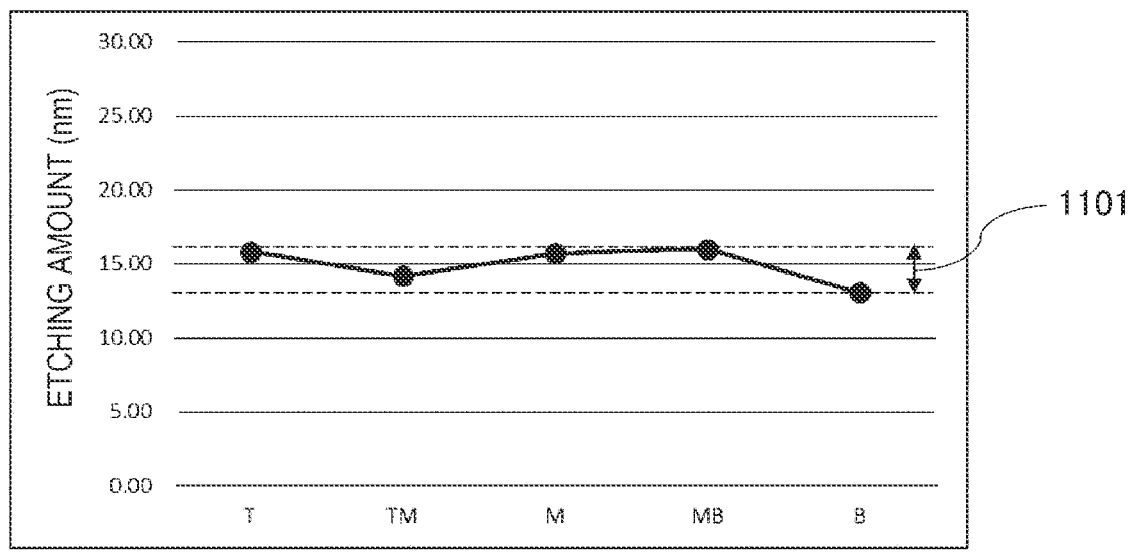
FIG. 11 is a diagram illustrating a relation between the depth of the trench and the etching amount when the radio frequency power is time-modulated.

FIG. 11 is a diagram illustrating a relation between the depth of the trench and the etching amount when the radio frequency power is time-modulated. The etching amount has a maximum value of 16.03 nm at the MB portion and a minimum value of 13.06 nm at the B portion, and an etching amount difference 1101 in the trench depth direction is 2.97 nm, which is improved.

Operations and Effects

During a time when the microwave is OFF, the $CF_4$ gas and the like that supply the etchant are dispersed in the trench 305. When the microwave is turned ON in this state, the etchant is dispersed and reacted in the trench 305 as compared with a case where the microwave is not time-modulated. As a result, it is considered that the etching amount difference in the trench depth direction is improved.

[Dependence of Effective Power of Radio Frequency Power]

Figure 12:
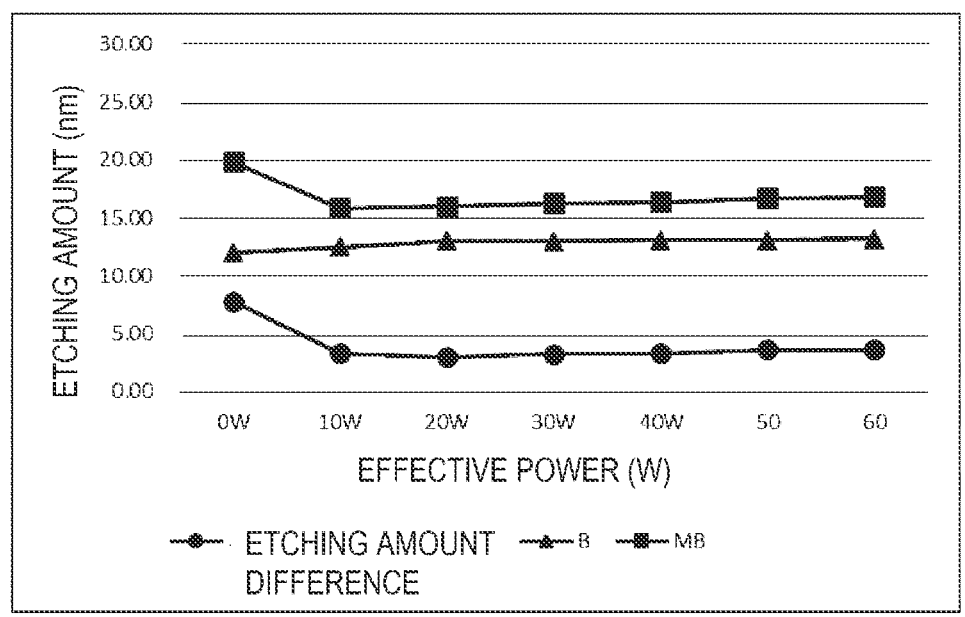
FIG. 12 is a diagram illustrating an etching amount difference when effective power of the radio frequency power is changed from 0 W to 60 W.

Next, dependence of the effective power and the distribution of the etching amount were examined in the state where the microwave and the radio frequency power were time-modulated. Among the conditions shown in Table 3, the duty of the radio frequency power was set to 30% such that the effective power in the second etching step (RF-bias ON) 607 was changed from about 0 W to about 60 W, then the plasma process was performed while the power of the radio frequency power was changed to 0 W (the effective power of 0 W), 33.3 W (the effective power of 10 W), 66.7 W (the effective power of 20 W), 100 W (the effective power of 30 W), 133.3 W (the effective power of 40 W), 166.7 W (the effective power of 50 W), and 200 W (the effective power of 60 W). FIG. 12 is a diagram illustrating the etching amount difference when the effective power of the radio frequency power is changed from 0 W to 60 W. The etching amount difference in the trench depth direction when the effective power was 0 W was showed to have a maximum value of 7.81 nm. When the effective power was increased from 0 W to 20 W, the etching amount difference was decreased, and the etching amount difference was 2.97 nm when the effective power was 20 W. When the effective power was increased from 20 W to 60 W, the etching amount difference was increased, and the etching amount difference was 4.02 nm when the effective power was 60 W. In addition, no damage on the surface of the stacked structure was confirmed up to when the effective power was 60 W. As described above, a good etching amount difference was obtained when the power was in the range of 10 W to 30 W from the viewpoint of the dependence of the power of the radio frequency power, but the range was expanded to a range of 10 W to 50 W from the viewpoint of the dependence of effective power of the radio frequency power.

Operations and Effects

As a reason why the preferable effective power range was obtained, the dispersion of the gases for supplying the etchant when the microwave is turned OFF can be considered, as described in the time modulation of the radio frequency power. Further, as a reason why the range of the effective power in which no damage on the surface of the stacked structure occurs was widened, it is considered that the etching amount from an upper side of the protective film 304 and the silicon oxide films 302 on the surface of the stacked structure can be reduced by setting a time during which the microwave and the radio frequency power are turned off. From the above, it was found that it is desirable to set the effective power in the range of 10 W to 50 W when the power of the microwave is set to 700 W, the frequency is set to 1000 Hz, and the duty is set to 90%, and the frequency of the radio frequency power is set to 1000 Hz and the duty is set to 30%.

The embodiment of the invention is described above, but the invention is not limited to the embodiment described above, and various modifications can be made without departing from the scope of the invention.

For example, the preferable ranges of the power, the application time, the effective power, and the like of the radio frequency power supply can be appropriately adjusted and determined according to the desirable etching amount difference in the trench depth direction.

REFERENCE SIGNS LIST

100 plasma processing apparatus
101 vacuum container
102 sample stage
103 oscillator
104 first radio frequency power supply
105 shower plate
106 dielectric window
107 processing chamber
108 gas supply device
109 vacuum exhaust port
110 waveguide
111 magnetic field generating coil
112 coil case 113 wafer
114 matching circuit
115 second radio frequency power supply
116 radio frequency filter
117 direct current power supply
201 first cycle
202 first depositing step
203 first etching step
204 repetition determination step
205 second cycle
206 second depositing step
207 second etching step (RF-bias OFF)
208 repetition determination step
301 polycrystalline silicon
302 silicon oxide film
303 tungsten film
304 protective film
305 trench
501, 801, 1101 etching amount difference
601 first cycle
602 first depositing step
603 first etching step
604 repetition determination step
605 second cycle
606 second depositing step
607 second etching step (RF-bias ON)
608 third etching step (RF-bias OFF)
609 repetition determination step

The invention claimed is:

1. A plasma processing method for plasma-etching a tungsten film of a stacked film formed by alternately stacking an insulating film and the tungsten film, the plasma processing method comprising:
   a first depositing step of depositing a deposited film;
   a first etching step of etching the tungsten film after the first depositing step;
   a second depositing step of depositing a deposited film;
   a second etching step of etching the tungsten film by using a mixed gas containing a $Cl_2$ gas, an $N_2$ gas, a $CF_4$ gas and a $C_4F_8$ gas after the second depositing step; and
   a third etching step of etching the tungsten film after the second etching step, wherein
   the second depositing step is performed after the first depositing step and the first etching step are repeated a predetermined number of times, and
   the second depositing step, the second etching step, and the third etching step are repeated a predetermined number of times.

2. The plasma processing method according to claim 1, wherein
   the insulating film is a silicon oxide film.

3. The plasma processing method according to claim 1, wherein
   the third etching step is performed by using a mixed gas containing a $Cl_2$ gas, an $N_2$ gas, a $CF_4$ gas and a $C_4F_8$ gas.

4. The plasma processing method according to claim 3, wherein
   the second etching step is performed while radio frequency power is supplied to a sample stage on which a sample having the stacked film is placed, and
   the third etching step is performed without supplying radio frequency power to the sample stage.

5. The plasma processing method according to claim 4, wherein
   the second depositing step is performed by using a $C_4F_8$ gas.

* * * * *